United States Patent
Piovano et al.

[11] Patent Number: 5,258,698
[45] Date of Patent: Nov. 2, 1993

[54] METHOD AND DEVICE FOR CONTROLLING THE WORKING DEPTH FOR A NUMERICALLY CONTROLLED MACHINE TOOL

[75] Inventors: Luigi Piovano, S. Giusto Canavese; Guido Gaida, Ponderano; Giuseppe Franciscono, Alice Castello; Renato Ottone, Cascinette d'Ivrea, all of Italy

[73] Assignee: Pluritec Italia S.p.A., Burolo, Italy

[21] Appl. No.: 727,568

[22] Filed: Jul. 9, 1991

[30] Foreign Application Priority Data

Aug. 7, 1990 [IT] Italy .............................. 67620

[51] Int. Cl.$^5$ .................. H02P 5/40; B23B 39/08
[52] U.S. Cl. .......................... 318/569; 318/573; 219/121.7; 408/35; 483/11
[58] Field of Search ................ 318/560–574; 364/474.10–474.29; 219/69.12, 69.1, 69.15, 69.17; 408/35; 29/38 R; 82/129, 159; 204/224 M, 129.35

[56] References Cited

U.S. PATENT DOCUMENTS

| | | |
|---|---|---|
| 3,555,962 | 1/1971 | Wolf. |
| 3,593,083 | 7/1971 | Blaschke. |
| 4,610,074 | 9/1986 | Katsube et al. ............ 408/35 X |
| 4,614,020 | 9/1986 | Kawada et al. ............ 408/35 X |
| 4,669,927 | 6/1987 | Zeller ........................ 408/13 |
| 4,765,784 | 8/1988 | Karwan ..................... 408/10 |
| 4,813,122 | 3/1989 | Watanabe et al. ......... 408/35 X |
| 4,835,838 | 6/1989 | Hirose ....................... 29/568 |
| 4,865,494 | 9/1989 | Gudow ...................... 408/13 |
| 4,887,493 | 12/1989 | Drake ....................... 29/800 |
| 5,010,232 | 4/1991 | Arai et al. ................. 219/121.7 |
| 5,131,481 | 7/1992 | Smith ....................... 175/428 |

FOREIGN PATENT DOCUMENTS

2038157 5/1972 Fed. Rep. of Germany.
3719167 11/1988 Fed. Rep. of Germany.

OTHER PUBLICATIONS

Soviet Inventions Illustrated Section P/Q; week D41, Nov. 18, 1981, Derwent Publications Ltd., London Great Britain and Soviet Union; A-797847 (Diamond Borer Radi); Jan. 23, 1981.
Patent Abstracts of Japan; vol. 6, No. 207 (M-165)(1085); Oct. 19, 1982; and JP-A-57114340; (Fujitsu Fanuc); Jul. 16, 1982.
Patent Abstracts of Japan; vol. 12, No. 459 (M-770)(3306); Dec. 2, 1988; and JP-A-63185554; (Osaka Kiko); Aug. 1, 1988.
Patent Abstracts of Japan; vol. 13, No. 258 (M-838) *3606); Jun. 15, 1989; and JP-A-164750; (Hitachi Seiko) Mar. 10, 1989.
Patent Abstracts of Japan; vol. 12, No. 197 (M-706)(3044); Jun. 8, 1988; and JP-A-632645; (Mitsubishi Electric); Jan. 7, 1988.
IBM Technical Disclosure Bulletin; vol. 33, No. 3B; Aug. 1990; pp. 150–154; Armonk, N.Y., US; "Variable Depth Blind Hole Drilling".

*Primary Examiner*—Paul Ip
*Attorney, Agent, or Firm*—Fish & Richardson

[57] ABSTRACT

The device is provided on a machine tool, wherein the drilling or milling operating head (12) comprises an axially movable spindle (14) and a workpiece hold-down (17), and wherein the working depth is controlled according to the relative position of the tool (16) with respect to the hold-down (17), defined by sensing a reference member (56) by means of the tool (16). To avoid the errors due to the thermal expansion in defining the reference position between the tool and the hold-down, before the reference member (56) is sensed, an electric power supply heats the spindle (14) by sequentially energizing the phases of the statoric coil of the spindle electric motor (76). The reference member (56) comprises a proximity sensor (64) operated by the tool (16) through an air pad piston (67).

16 Claims, 7 Drawing Sheets

METHOD AND DEVICE FOR CONTROLLING THE WORKING DEPTH FOR A NUMERICALLY CONTROLLED MACHINE TOOL

BACKGROUND OF THE INVENTION

This invention relates to a method and a device for controlling the working depth for a numerically controlled machine tool, having at least an operating head provided with a tool carrying spindle associated with a workpiece hold-down, wherein the working depth is controlled according to the relative position of the tool of said spindle with respect to said hold-down. Particularly the invention relates to the machines for drilling and/or milling printed circuits boards, wherein a controlled working depth is required.

In the manufacture of sophisticated printed circuit boards, as for example the multilayer circuits and the circuits with a substrate formed of rigid layers interspersed with flexible layers, the need arises for drilling and/or milling the board only partially, that is with a maximum precision controlled working depth.

It is known a machine for drilling multilayer boards, wherein the working depth is controlled according to the relative position of the tool on the spindle with respect to workpiece hold-down. Particularly, when the spindle is standing, at first a reference position between the tip of the tool and the hold-down is defined, and subsequently the working depth is controlled according to the reference position. This machine is not satisfactory, since during the working the spindle temperature increases variably, and is substantially different from the one reached during the definition of the reference position.

It is an object of the invention to provide a method and a device for controlling the working depth in a machine tool of the above type, which is of the maximum precision and repeatability and overcomes the above disadvantage.

SUMMARY OF THE INVENTION

This object is obtained by the method according to the invention, wherein when said spindle is standing a reference position between said tool and said hold-down is defined, and which is characterized by a step of heating said spindle at a temperature substantially corresponding to the running temperature of said spindle, and a step of sensing a reference member by means of said tool when said spindle is so heated.

A preferred embodiment of the invention is hereinafter disclosed by way of example with the help of the accompanying drawings.

DESCRIPTION OF THE PREFERRED EMBODIMENT

Figure 1:
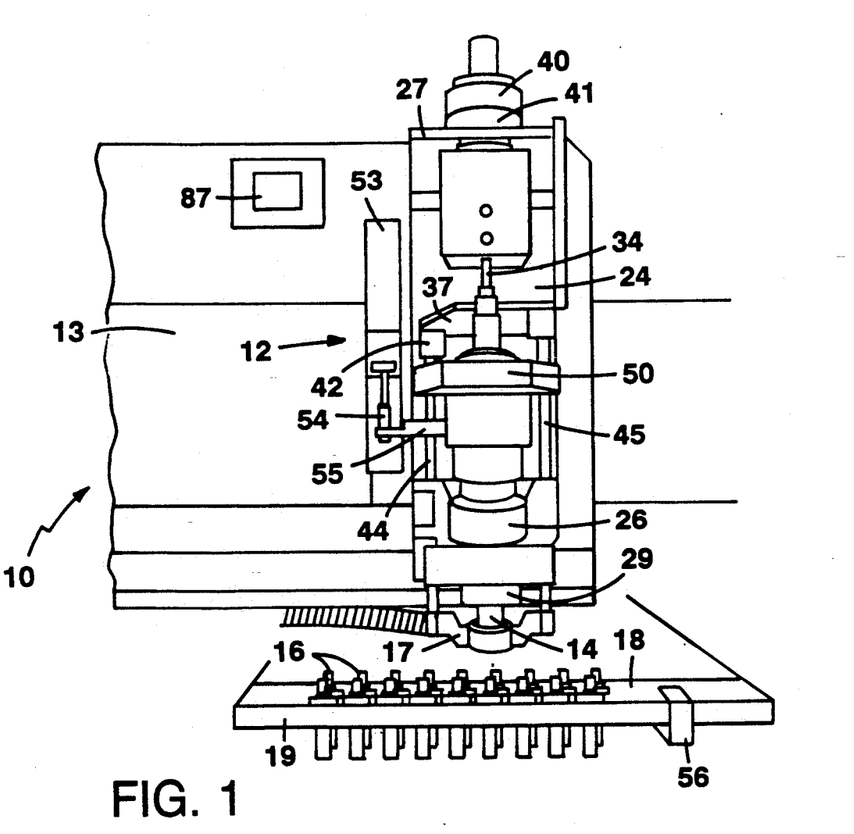
FIG. 1 is a partial perspective view of a machine tool for working printed circuit boards, embodying a working depth control device according to the invention.
Figure 2:
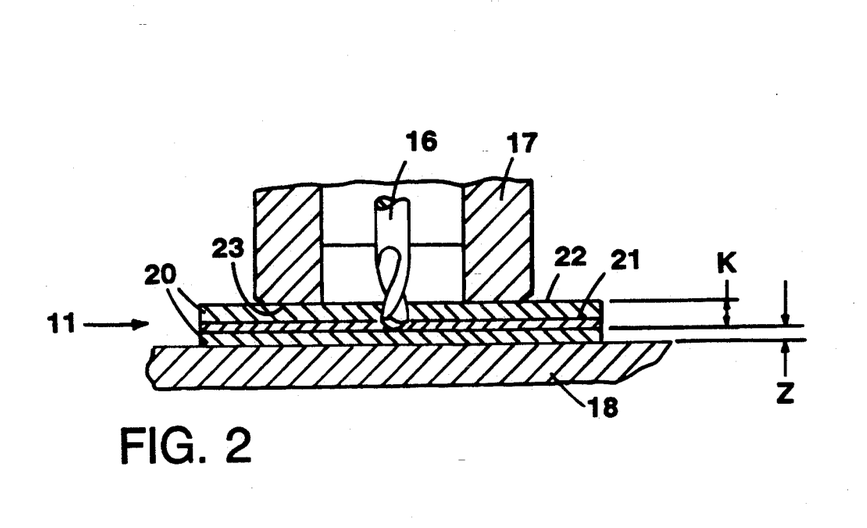
FIG. 2 is a diagrammatic detail of FIG. 1, in a very enlarged scale.
Figure 3:
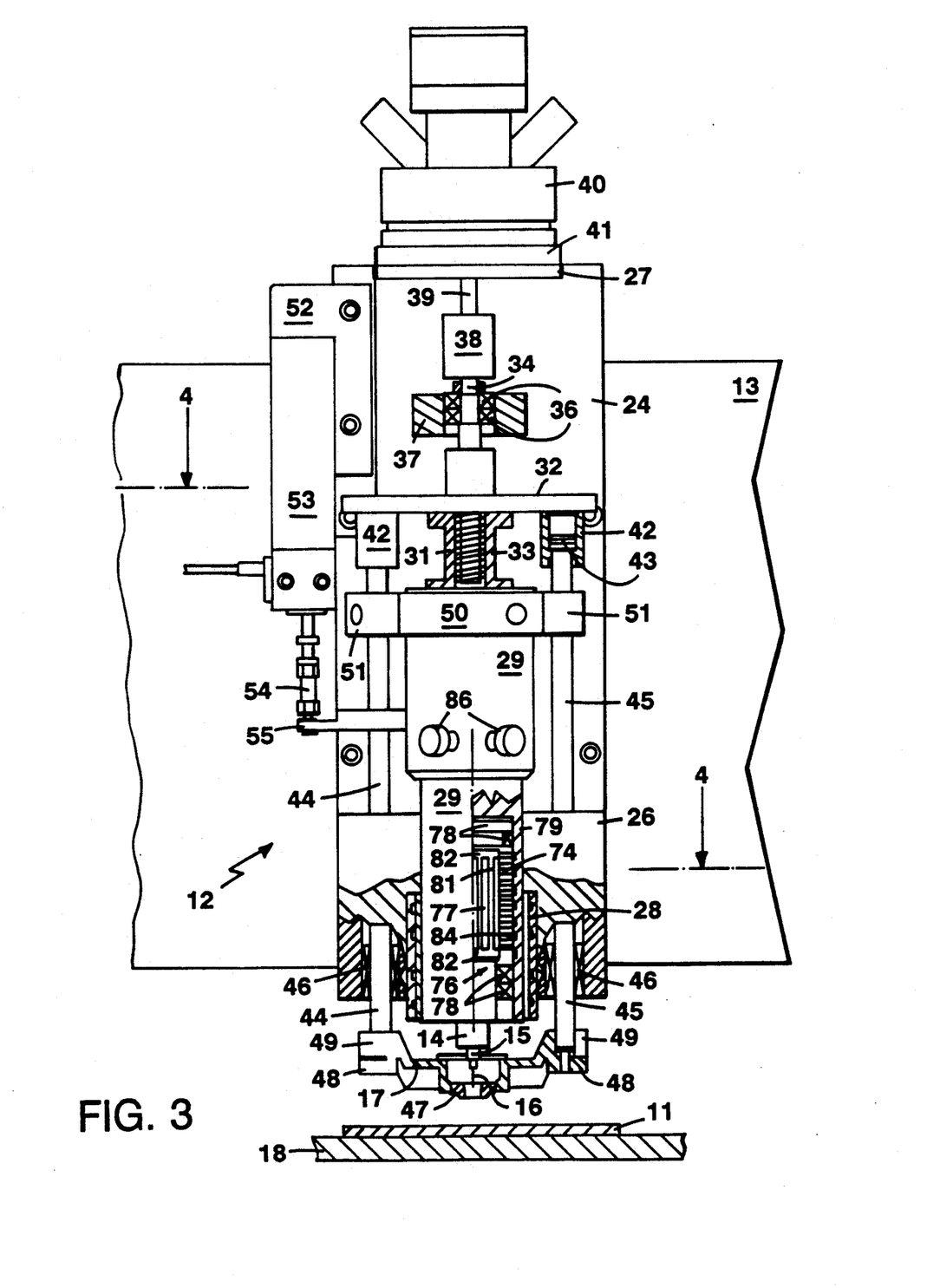
FIG. 3 is a partial sectional front view of an operating head of the machine of FIG. 1, in enlarged scale.

With reference to the FIGS. 1-3, the numeral 10 generically indicates a machine tool for mechanically working printed circuit boards 11, for example multilayer printed circuits. The machine 10, for example a drilling machine, comprises at least an operating head 12 carried by a slide slidable on a stationary cross bar 13, along the horizontal axis X. The head 12 comprises a tool carrying spindle 14, movable along the vertical axis Z. The spindle 14 is provided with the conventional autolocking collet 15 operable in a known manner for locking and unlocking a tool 16. The operating head 12 also comprises a workpiece hold-down 17 adapted to be yieldably displaced downwards to lock the boards 11 during the drilling.

The drilling machine 10 also comprises a workpiece carrying table 18 movable in a known manner along the horizontal axis Y. The guides for the displacement of the head 12 along the axis X and of the table 18 along the axis Y are provided with pneumostatic bearings. The drilling machine 10 also comprises a magazine 19 formed of a zone of the table 18, which is provided with a set of seats housing a corresponding set of tools 16. These latter are selected by displacing the head 12 along the axis X and the table 18 along the axis Y. The selected tool 16 is secured to the spindle 14, or relocated into the magazine 19, by displacing the spindle 14 along the axis Z. Finally the drilling machine comprises a numeric control apparatus 30 (FIG. 7), programmable for controlling the movements of the head 12, the table 18 and the spindle 14 along the relevant axes, as well as for selecting and changing the tools 16, and for controlling the working functions.

As it is known, a printed circuit board 11 (FIG. 2) may be formed of one or more rigid layers 20, for example of plastic reinforced fiber glass. It may possibly comprise at least a flexible layer 21, for example of Mylar (registered trade mark), located between two rigid layers 20. These layers 20, 21 are individually printed, on one or both faces, as to obtain the relevant conductive paths. Then the various layers 20, 21 are mutually bonded and are mechanically worked, i.e. drilled and/or milled. The drilling and milling operations must often be carried out till a predetermined working depth K from the upper surface 22 of the multilayer board 11, whereby the depth K must be defined with a very high precision.

Since the upper surface 22 of the board 11 may be non uniform and may present irregularities in the flatness, the position of the tool 16, defined by a dimension Z with respect to the table 18, may not coincide with the depth K defined by the surface 22. Therefore the numeric control apparatus 30 must be programmed to control the feeding of the spindle along the axis Z according the depth K. This depth is defined departing from a reference, or zero position of the tip of the tool 16 in respect to the lower surface 23 of the workpiece hold-down 17, when this latter blocks the board 11 on the table 18.

Particularly, the slide of the operating head 12 comprises a support structure 24 (FIG. 3) secured downwards to a hollow body 26 and upwards to a bored plate 27. Mounted on the body 26 is a cylindrical pneumostatic bearing 28, wherein a sleeve 29 supporting the spindle 14 is vertically slidable but not rotatable. Secured to the sleeve 29 is a nut 31, in turn secured to a plate 32 vertically slidable on the support 24. The nut 31 is engaged by a precision screw 33 carried by a stem 34, which is rotatable on bearings 36 of a bracket 37 secured to the structure 24.

The stem 34 is connected, through a joint 38, with the shaft 39 of a direct current electric motor 41 associated with a main position transducer 40 or encoder. The transducer 40 is adapted to indicate, in the range of the pitch of the screw 33, the axial position of the sleeve 29 to the numeric control apparatus 30 (FIG. 7), to cause the motor 41 to vertically displace along the axis Z the sleeve 29 (FIG. 3) and the spindle 14. This displacement is normally referred to the upper surface of the table 18 (FIG. 2).

The plate 32 (FIG. 3) carries a pair of pneumatic cylinders 42 cooperating with a pair of pistons 43 secured to a pair of columns 44 and 45, in turn vertically slidable into two seats 46 of the body 26. The hold-down 17 is provided with a locking bushing 47 carrying the surface 23 and with two bored projections 48 secured through two jaws and screws 49 to the columns 44 and 45. Therefore the hold-down 17 is yieldably moved downwards with respect to the sleeve 29 to lock the board 11 on the table 18.

Figure 4:
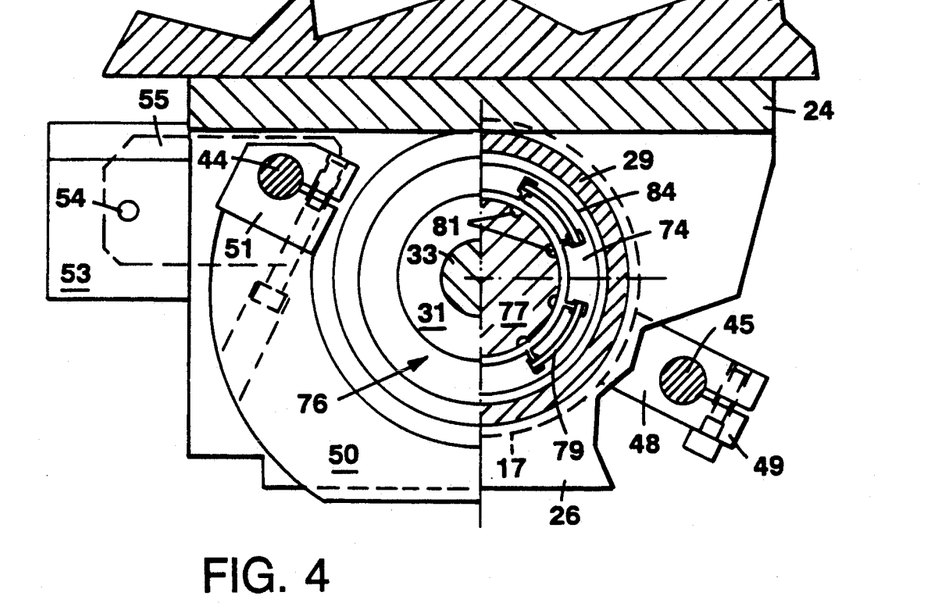
FIG. 4 is a horizontal section according to the line IV—IV of FIG. 3.

The columns 44 and 45, near the two pistons 43, are also connected with an additional bracket 50 (FIG. 4), which is secured to them through two jaws and screws 51. The bracket 50 has the function of rendering furtherly rigid the hold-down 17 in blocking the plate 11 and of minimizing the negative effects of the radial stresses of the hold-down 17.

Furthermore, secured to the support 24 is a plate 52 carrying a linear position transducer 53 of high precision. This latter comprises a slide 54 secured to the column 44 by means of a bracket 55. The transducer 53 has the purpose of measuring and indicating in real time to the control apparatus 30 (FIG. 7) the position of the hold-down 17 along the axis Z.

Figure 5:
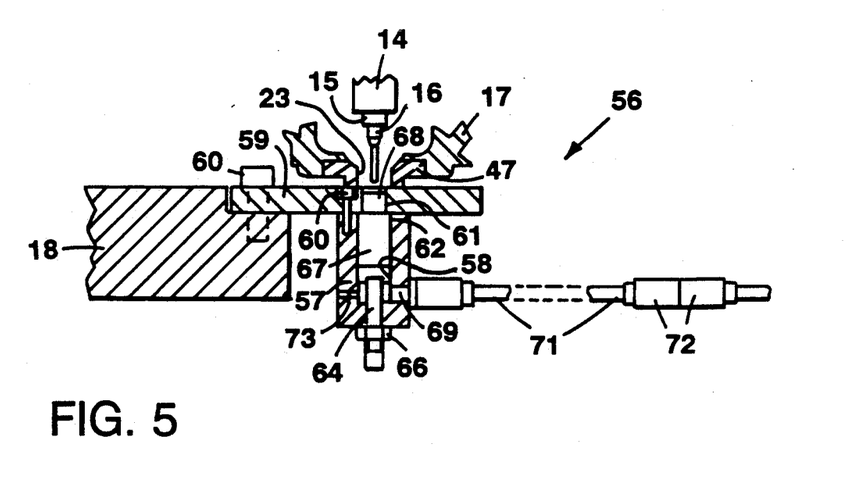
FIG. 5 is a section of a detail of FIG. 1, in enlarged scale.
Figure 7:
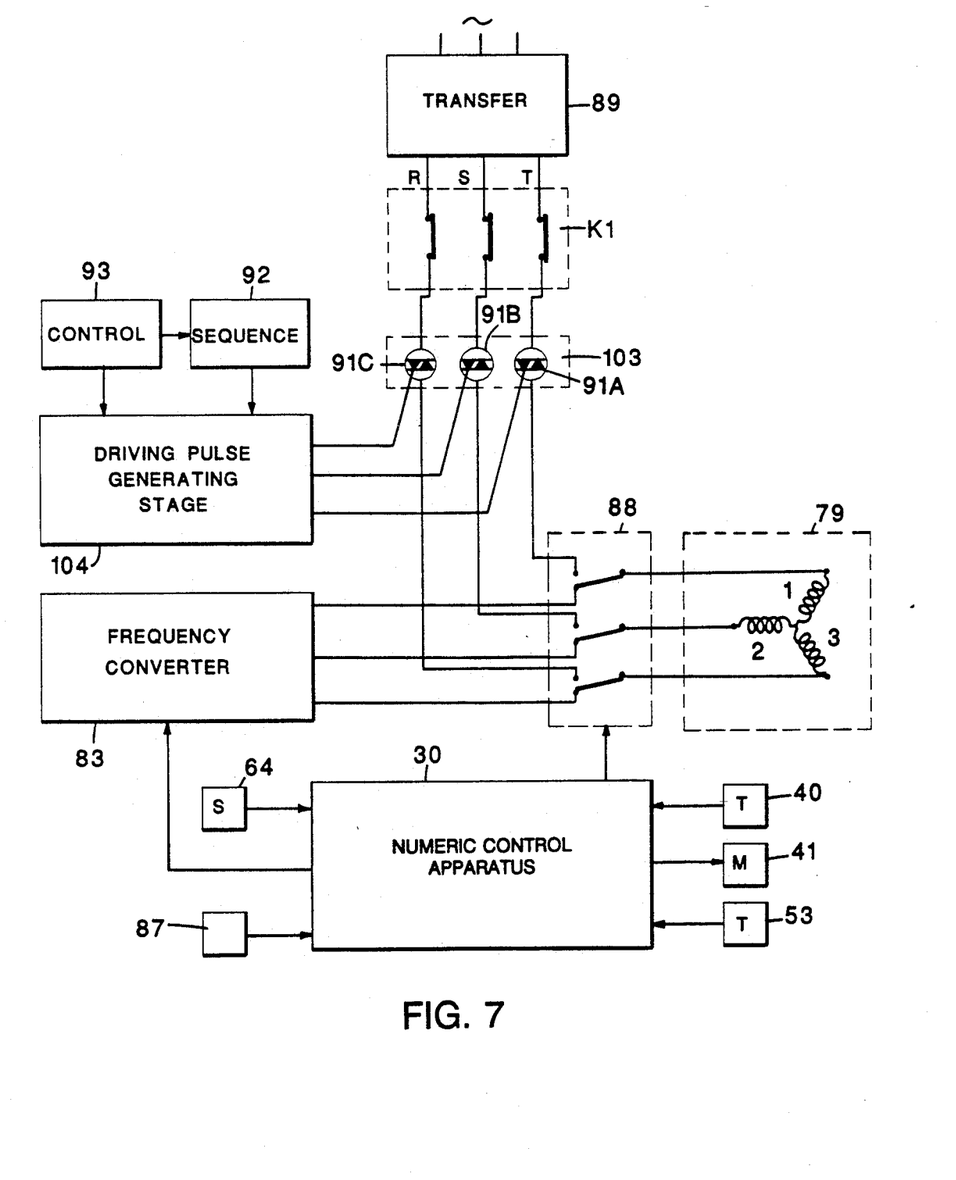
FIG. 7 is a schematic block diagram of the control apparatus and of the operating and heating circuits of the spindle of FIG. 3.

The tool magazine 19 is provided with a measuring station including a sensing member, generically indicated with 56 (FIG. 1), which comprises a cylinder 57 (FIG. 5) forming a cylindrical chamber 58. The cylinder 57 is secured to the table 18 by means of a plate 59 and a set of screws 60. The plate 59 is provided with a hole 61 forming a shoulder 62 with the surface of the chamber 58. Housed in an axial hole of the cylinder 57 is a proximity sensor 64 protruding for a certain length into the chamber 58. The sensor 64 is secured to the cylinder 57 by a bolt 66 and is electrically connected with the control apparatus 30 (FIG. 7).

Slidable into the chamber 58 (FIG. 5) is an air pad piston 67 having a portion 68 of reduced diameter, which is housed into the hole 61 of the plate 59 and forms on the piston 67 a shoulder normally urged by the air pressure to engage the shoulder 62 of the plate 59. In this position the lower surface of the piston 67 is located at a distance of about 2 mm from the sensor 64. The cylinder 57 is also provided with a radial hole 69, connected to an air duct 71, in turn connected to the pneumostatic bearing system of the machine, through a pressure regulator 72.

Finally the cylinder 57 is provided with a second calibrated radial breather hole 73, to allow an accurate regulation of the air pressure into the chamber 58, even for very low values of the pressure, i.e. equivalent to a force of about 10 g on the piston 67. By pushing the upper surface of the piston 67 by means of the tool 16 as to overcome the pressure of the air into the chamber 58, the piston 67 is moved downwards causing the sensor 64 to emit a corresponding electric signal. Therefore the sensor 64 operates as a high precision electronic switch.

The spindle 14 (FIGS. 3 and 4) is rotated by an electric motor 76 of the asynchronous three-phase alternate current type, including a stator 74 secured to the sleeve 29 and a rotor 77 bodily movable with the spindle 14 on a set of bearings 78. The stator 74 is provided with the conventional inductor, or statoric electric coil 79, comprising three phases 1, 2, 3 (FIG. 7). In turn the rotor 77 (FIGS. 3 and 4) is of the squirrel cage type and comprises a set of conductive bars 81, the ends of which are connected by two conductive end rings 82. The statoric coil 79 is supplied by the mains through a frequency converter 83 (FIG. 7) adapted to rotate the rotor 77 at any speed comprised between 18,000 and 120,000 rev/min. To this end, the frequency converter 83 is controlled by the control apparatus 30 according to the kind of working and to the used tool 16.

Since the operation of the motor 76 (FIG. 3) produces a certain quantity of heat, it is necessary to cool the motor 76 during the drilling. To this end, inside the sleeve 29 a double coil duct 84 is provided, wherein a cooling liquid is circulated through two ducts 86. Therefore, departing from the instant of the start of the motor 76, the temperature of the rotor 77 increases, till after a predetermined interval of time it reaches a running temperature. On the contrary, when the motor 76 is stopped, departing from the instant of the deenergization of the coil 79 the temperature of the rotor 77 and the spindle 14 rapidly decreases.

The variation of the temperature of the rotor 77 and of the spindle 14 produces a certain variation in the relevant thermal expansion. Since the measurement of the reference position or distance between the tip of the tool 16 (FIG. 2) and the surface 23 must be carried out with the spindle 14 standing, an error affecting the depth K occurs when the spindle 14 operates at running speed.

Figure 6:
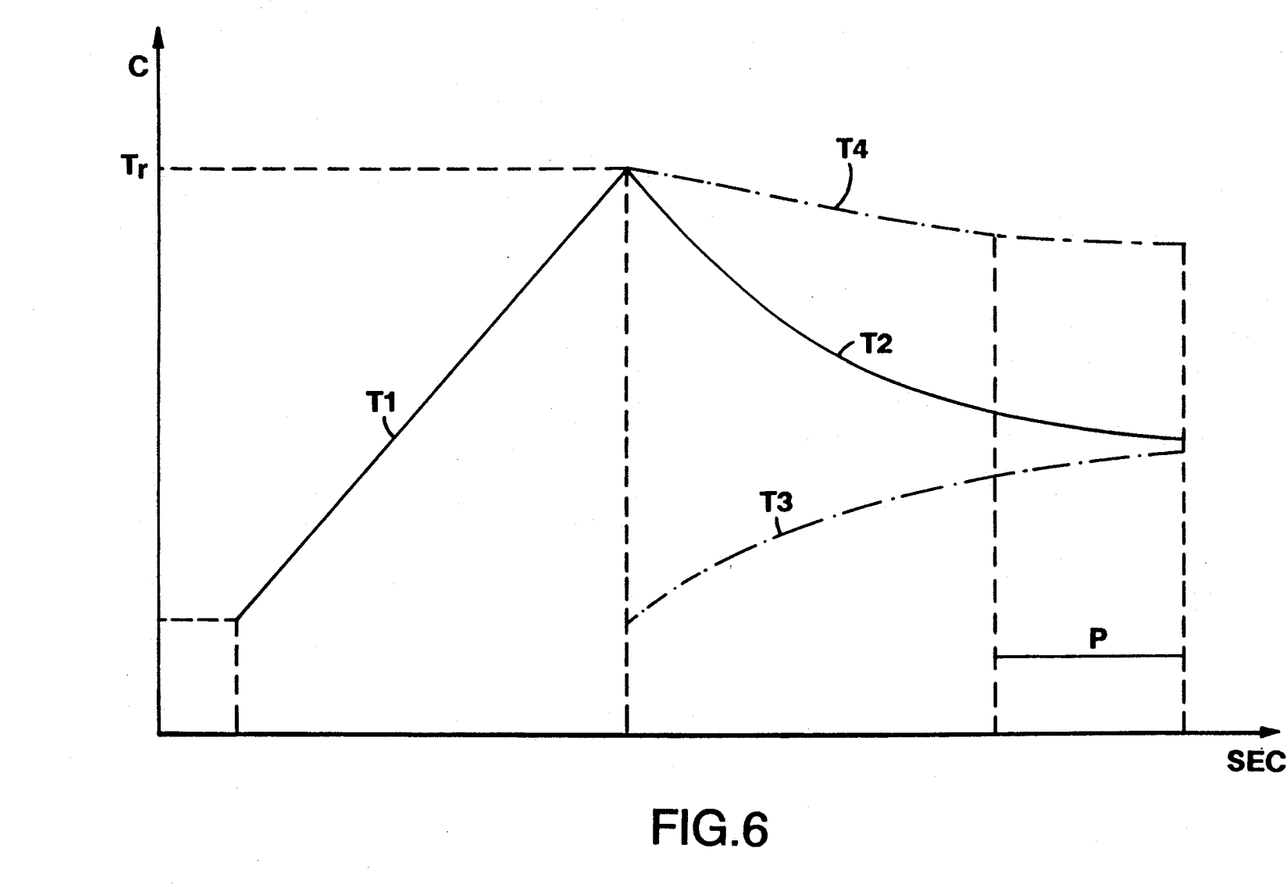
FIG. 6 is a diagram of the temperature of the spindle in the measurement of the reference position.

According to the invention to reduce such an error, when the motor 76 is deenergized to determine the abovesaid reference position, the spindle 14 is firstly heated till a temperature corresponding to the running one, and then the reference position is determined when the spindle 14 has reached substantially such a temperature. To this end, a thermostat 87 (FIG. 7) adapted to sense the temperature of the cooling liquid is provided. When the apparatus 30 controls a cycle of measurement of the reference position, it causes the motor 76 to rotate for a predetermined interval of time, whereby the temperature of the spindle 14 increases according to the diagram T1 of FIG. 6.

When this temperature has reached a value Tr corresponding to the one of the running temperature, the thermostat 87 (FIG. 7) generates a consent signal for the apparatus 30, which controls the converter 83 as to deenergize the coil 79. The temperature of the spindle 14 should then decrease progressively according to the diagram T2 of FIG. 6. Then the apparatus 30 controls a switch 88 (FIG. 7) which, through a three-phase remote controlled switch K1, causes now a power supply 89 to energize the statoric coil 79 with a 24 V, 50 Hz monophase current.

As it is known, such a monophase current generates on the stator 74 (FIG. 4) an alternate and non rotating resulting magnetic field, causing the conductive bars 81 of the rotor 77 to operate as the secondary of a transformer. Therefore in such a case a current flows into the bars 81 and generates heat causing the temperature of the rotor 77 and of the spindle 14 to increase according to the diagram T3 of FIG. 6. The resultant of the two diagrams T2 and T3, represented in FIG. 6 by the diagram T4, indicates the temperature of the so heated spindle 14 after the motor 76 stops. Such a temperature is substantially constant and corresponds to the running temperature of the spindle 14. The measurement of the reference position of the tool 16 is carried out in the condition represented in FIG. 6 by the time interval P.

Figure 8:
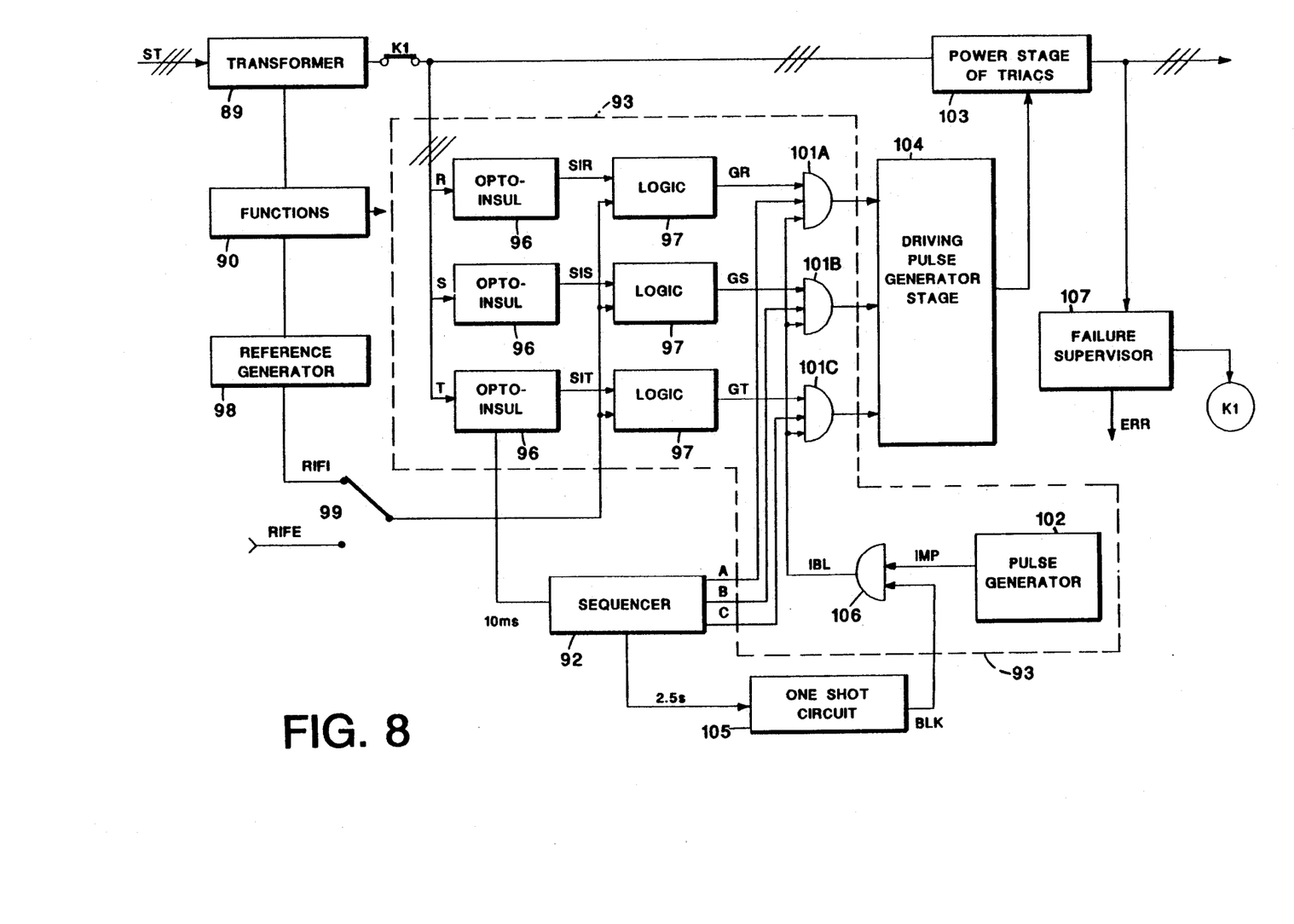
FIG. 8 is a logic block diagram of a heating circuit.

The power supply 89 is formed of a 36 V three-phase power transformer (FIG. 8) also power supplying a set of functions indicated by 90. Each phase R, S, T of the output of the transformer 89 supplies the monophase current, which is applied to a pair of phases of the statoric coil 79 (FIG. 7). Particularly, the three phases 1, 2, 3 of the statoric coil 79 are connected with the transformer 89, through a power stage 103 of a group of three electronic switches 91A, 91B, 91C, connecting the remote controlled switch K1 to the switch 88. Each switch 91A-91C is of the type known as "triac", and is controlled by the sinusoidal voltage 94 (FIG. 9) at the mains frequency, which is supplied by the transformer 89.

The triac can be enabled at any electric angle of the sinusoid 94, but is disabled always at the zero crossing of the sinusoid 94. The driving pulses for enabling the triacs 91A-91C (FIG. 7) are supplied by three outputs of a driving pulse generating stage 104. The triacs 91A-91C are sequentially controlled by a sequencer 92 enabled simultaneously with the switch 88, through a control circuit 93. The sequencer 92 has the purpose of controlling the triacs 91A-91C as to switch off the monophase currents R, S, T supplied by the transformer 89 one at a time, for energizing each time the corresponding pair of phases 1, 2, 3 of the statoric coil 79, whereby the thermic and electric stresses are distributed along the cycle.

Figure 9:
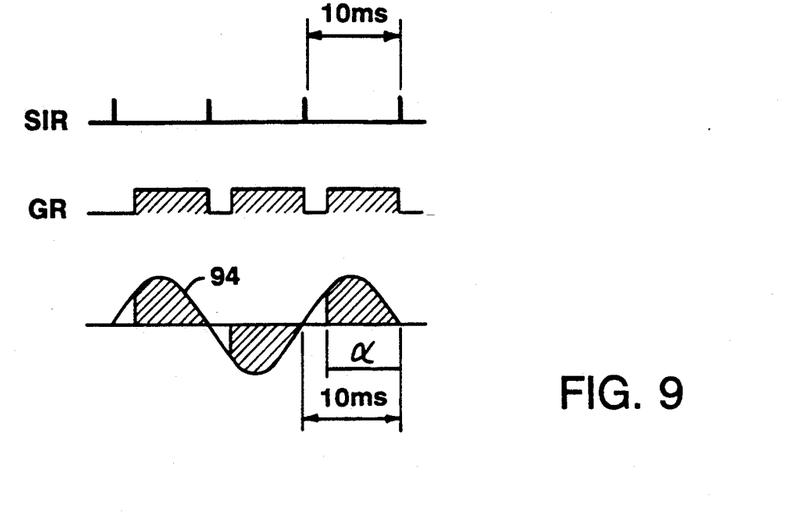
FIGS. 9 and 10 are two diagrams of the electric signals of the circuit of FIG. 8.

The control circuit 93 (FIG. 8) comprises a group of three optoinsulators 96 associated to the three phases of the transformer 89. Each optoinsulator 96 generates a corresponding pulse SIR, SIS, SIT at each zero crossing of the relevant sinusoid 94, that is each 10 ms. In FIG. 9 only the SIR pulses are represented; the other two sets of pulses SIS and SIT are electrically mutually offset 120°. The circuit 93 also comprises for each phase R, S, T a logic block 97 (FIG. 8), formed of a ramp generator and a comparator of the signal with a reference voltage. Each block 97 is adapted to generate a corresponding square signal GR, GS, GT (FIG. 9), which defines, inside each positive and negative semicycle, the conductive time or angle α of the relevant triac 91A-91C. Therefore the raising front of the signals GR, GS, GT inside the semicycle is advanced or delayed, whereby the triac 91A-91C (FIG. 7) enables the adjustment of the amount of heating for the rotor 77.

The reference voltage can be genereyed by a generator 98 as inner reference voltage RIFI, for controlling the heating at a fixed temperature. Alternately an outer reference voltage RIFE can be generated according to the temperature foreseen for the rotor 77 in the running of the programmed working. The two references can be selected by means of a switch 99.

Figure 10:
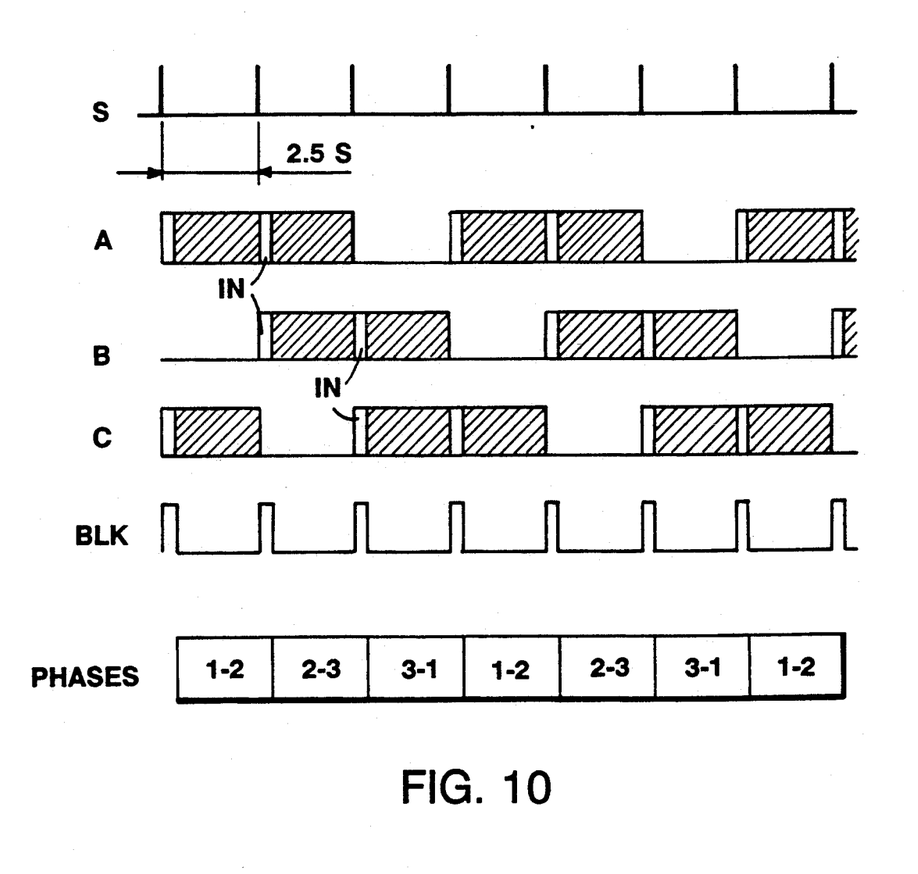

The sequencer 92 is driven by the phase T of the optoinsulators 96 (FIG. 8), and divides the 10 ms clock by 256, thus obtaining a pulse signal S (FIG. 10), at a time interval of 2560 ms (~2.5 s). This signal is used as a clock for a module 3 counter, comprised in the same sequencer 92, which generates three sequence signals A, B, C, each with a time of about 5 s overlapped in time about 2.5 s, as indicated in FIG. 10.

The circuit 93 (FIG. 8) also comprises three AND gates 101A, 101B, 101C adapted to receive respectively the gate signals A, B, C and a set of initiation signals IMP, supplied by a pulse generator 102 at a frequency of 5 kHz. The output signals of the gates 101A-101C, through the driving pulse stage 104, control the power stage 103 of the relevant triac 91A-91C. Thus the sequencer 92 generates a set of cycles or intervals of 5 s, each of which enables the corresponding triac 91A-91C in sequences mutually offset ⅓ of such a cycle.

In the switching instants of each triac 91A-91C an instantaneous condition could occur, where the three triacs 91A-91C are simultaneously enabled, whereby the three phases of the coil 79 are simultaneously enabled. To avoid that the rotor 77 could start the rotation, a short dead time interval IN is generated between the disabling of one phase and the enabling of the next following phase. To this end the clock S of the sequencer 92 is used also as a trigger of a one-shot circuit 105 to generate a blank pulse BLK of a predetermined duration. This pulse BLK, through an AND gate 106, generates a signal IBL which is applied to a third input of the gates 101A-101C, and masks the signals IMP of the generator 102 during the interval IN.

The interval IN delays the enabling of the next following phase with respect to the disabling of the preceding phase. In the phase which is not switched off, the interval IN does not produce any inconvenient, since in any case no current is flowing therein in that instant. The current flowing each time at the output of the power stage 103 of the triac 91A-91C is sensed by a failure supervisor 107, and in case of presence of such failures, generates an inhibiting signal for the remote controlled switch K1.

The working depth controlling device operates as follows.

Upon having inserted a tool 16 into the spindle 14 (FIG. 1), the motor 76 is started to bring the temperature of the spindle 14 to running. Simultaneously the table 18 and the spindle 14 are displaced to bring this latter to the measurement station 56, the workpiece hold-down 17 being lowered with respect to the sleeve 29.

When the thermostat 87 indicates that the liquid of the coil 84 (FIG. 3) has reached the predetermined temperature, the apparatus 30 (see also FIG. 7) controls the converter 83 as to deenergize the coil 79. When the motor 76 stops, the apparatus 30 operates the switch 88, thus connecting the coil 79 with the transformer 89. Then the sequencer 92, through the control circuit 93, sequentially energizes the pairs of phases of the coil 79, as indicated in the lower line of FIG. 10, whereby the rotor 77 is heated to compensate the cooling subsequent to the stop.

After a predetermined time, sufficient for stabilizing the temperature of the rotor 77 to a value very close to the running one, the apparatus 30 causes the motor 41 to lower the sleeve 29 (FIG. 3) together with the spindle 14 and the hold-down 17. Particularly, at first the sleeve 29 operates a rapid approaching stroke, till a safety position, at its maximum speed under the control of the transducer 40. From this safety position, the sleeve 29 initiates a slow approaching stroke at a reduced speed to prevent that the impact of the tip of the tool 16 on the piston 67 (FIG. 5) of the measurement station could damage the tool 16.

During such a slow approaching, as long as the hold-down 17 lowers together with the spindle 14, the transducer 53 is incremented exactly as the main transducer 40, whereby the two measures give a zero difference. As soon as the hold-down 17 encounters the upper surface of the plate 59 (FIG. 5) of the measurement station, it is stopped, thus generating a difference between the indications of the two transducers 40 and 53. When the tool 16 engages the piston 67, this latter is lowered and energizes the proximity sensor 64. The signal emitted by this latter conditions the apparatus 30 to stop the motor 41 and to memorize the difference of positions accumulated by the transducers 40 and 53. The relative position of the tool 16 with respect to the hold-down 17 thus measures the reference distance for controlling the working depth.

Subsequently the apparatus 30, through the motor 41, returns the spindle 14 and the hold-down 17 to the upper rest position, and thereafter initiates the effective working. In controlling such a working, the apparatus 30 will apply the previously defined reference distance to each drilling stroke of the spindle 14, or during the sliding of the hold-down 17 in the milling, summing up the same to the dimension of depth K defined in the working program. Obviously the measuring operation of the reference position can be periodically repeated, for example after having inserted a tool 16 into the spindle 14, or at the beginning of the working of each board 11, or after having worked a predetermined number of holes.

From the above it is apparent that the control method of the working depth carried out by the machine comprises a first step of heating the spindle 14 at a temperature corresponding to the running temperature of the spindle 14, and a step of sensing a reference member 56 by means of the tool 16 when the spindle 14 is so heated. The heating of the spindle 14 compensates any error in determining the working depth K, due to the thermic expansion. Furthermore the use of a proximity sensor 64 associated with the air pad piston 67 increases the sensitiveness and repeatability. Finally the additional strong bracket 50 of the structure of the hold-down 17 removes any effect due to the radial stresses, particularly in the case of milling operations.

It is intended that various modifications and improvements can be made to the described device without departing from the scope of the claims. For example, it can be used in any machine tool wherein it is desired to correct the error due to the thermal expansions. Particularly it can be used in a drilling machine equipped for drilling printed circuit boards, predisposed between an upper dummy plate to be entered by the tool and a lower support plate.

Furthermore the heating of the spindle 14 can be obtained with means different from those above described, even without involving the statoric coil of the motor. In turn the control circuit 93 of the sequencer 92 can be replaced by a different signal generating circuit. Finally the transformer 89 can be replaced by a monophase power supply, which can be possibly connected between two predetermined phases of the coil 79 without using any sequencer, or enabling angle adjuster.

We claim:

1. A method for controlling the working depth for a numerically controlled machine tool for drilling or milling printed circuit boards, wherein at least an operating head is provided with a rotatable spindle carrying a removable tool, a workpiece hold-down associated with the rotatable spindle, said method comprising the following steps:

displacing the operating head to bring the rotatable spindle in correspondence with a reference member, heating at least a part of the rotatable spindle, sensing the temperature of the rotatable spindle during heating to define when a predetermined temperature corresponding to the running temperature of the rotatable spindle is reached, moving the rotatable spindle and the workpiece hold-down until the workpiece hold-down is stopped, additionally advancing the rotatable spindle to bring the tool to sense the reference member, detecting the distance covered by the additional advancing, storing the distances so covered, and controlling the working depth of the tool by use of the stored distances.

2. A method according to the claim 1, wherein said heating step comprises a selective dynamic preheating obtained by rotating said spindle at the working speed, and an electric heating of at least a part of said spindle.

3. A method according to the claim 2, wherein said spindle comprises an asynchronous polyphase electric motor, said electric heating being effected by sequentially energizing the phases of a statoric electric coil of said electric motor with a monophase electric current.

4. A method according to the claim 2, wherein said sensing step is effected by bringing said hold-down in a blocking position against a reference stop, and by applying with said tool a predetermined force against a pneumostatic support element associated with a proximity sensor.

5. A method according to claim 1, wherein said machine tool is adapted for drilling or milling multi-layer printed circuit boards, wherein said steps are repeated at least each changing of said tool on said spindle to be used for operating on said printed circuit boards at a controlling working depth.

6. In a numerically controlled machine tool having a workpiece holding table, at least an operating head, displacing means for mutually displacing said holding table and said operating head to selected working positions, a rotatable spindle mounted on said operating head, axially moving means for axially moving said spindle on said operating head, a working tool removably mounted on said spindle, and a workpiece hold-down associated with said head, said numerically controlled machine tool further comprising a working depth controlling device comprising a reference member carried by said table at a predetermined sensing position, control means conditionable for enabling said axially moving means to cause said tool to sense said reference member, position transducer means enabled by said control means for defining a mutual axial distance of said tool with respect to said hold-down upon said tool sensing said reference member, heating means conditionable for heating said spindle while said spindle is rotatably standing, temperature sensing means for sensing the temperature of said spindle, and conditioning means controlled by said temperature sensing means for conditioning said control means when a temperature corresponding to the running temperature of said spindle is sensed.

7. In a numerically controlled machine tool having a workpiece holding table, at least an operating head, displacing means for mutually displacing said table and said head to selected working positions, a rotatable spindle mounted on said head, an asynchronous electric motor for rotating said spindle, said electric motor including a rotor secured to said spindle and a stator having at least an electric coil, axially moving means for axially moving said spindle on said head, a working tool removably mounted on said spindle, and a workpiece hold-down associated with said head, said numerically controlled machine tool further comprising a working depth controlling device comprising a reference member carried by said table at a predetermined sensing position, control means conditionable for enabling said axially moving means to cause said tool to sense said reference member, position transducer means enabled by said control means for defining a mutual axial distance of said tool with respect to said hold-down upon said tool sensing said reference member, an electric power supply connectable with said electric coil to induce an electric current into said rotor causing the rotor temperature to increase without any rotation thereof, electric means for temporarily connecting said electric power with said electric coil, whereby said spindle is heated while it is rotatably standing, temperature sensing means for sensing the temperature of said spindle, and conditioning means controlled by said temperature sensing means for conditioning said control means when a temperature corresponding to the running temperature of said spindle is sensed.

8. A device according to claim 7, wherein said electric motor is of a polyphase type, and said power supply is adapted to supply a monophase current, said connecting means comprising a sequencer for cyclically connecting at least one phase of said coil with said power supply.

9. A device according to claim 8, wherein said connecting means comprise a plurality of electronic power switches located between the phases of said coil and said power supply, said sequencer cyclically operating a pair of said switches at a time for energizing a corresponding pair of phases of said coil.

10. A device according to claim 9, wherein said electric motor is of a three-phase type, said sequencer operating each one of said switches for an operating time substantially equal to twice the time of energization of a pair of phases of said coil, the operation of each pair of said switches being mutually out of phase by said energization time.

11. A device according to claim 9, wherein said switches are of a type adapted to allow a variation of the electric initiation angle, means being provided for variating said angle by inserting a wait time between the disabling of one pair of the switches and the enabling of the next following pair of said switches.

12. A device according to claim 7, wherein said motor is cooled by means of ducts where a cooling liquid is flowing and wherein said temperature sensing means comprises a thermostat for sensing the temperature of said liquid in said ducts, said conditioning means being enabled in response to the temperature sensed by said thermostat.

13. In a numerically controlled machine tool for drilling or milling printed circuit boards having a circuit boards holding table, at least an operating head, displacing means for mutually displacing said table and said head to selected working positions, a rotatable spindle mounted on said head, axially moving means for axially moving said spindle on said head, a working tool removably mounted on said spindle, and a circuit boards hold-down associated with said head and yieldably brought to a circuit boards blocking position, said numerically controlled machine tool for drilling or milling printed circuit boards further comprising a working depth controlling device comprising a reference member carried by said table at a predetermined sensing position, control means conditionable for enabling said axially moving means to cause said tool to sense said reference member, a reference stop associated with said reference member and adapted to stop said hold-down at said blocking position while said axial moving means are so enabled, a normally effective position transducer associated with said spindle, a second position transducer associated with said hold-down, said second position transducer being disabled by said control means upon said tool sensing said reference member to define a mutual axial distance of said tool with respect to said hold-down as difference of the position indications of said two transducers, heating means conditionable for heating said spindle while said spindle is rotatably standing, temperature sensing means for sensing the temperature of said spindle, and conditioning means controlled by said temperature sensing means for conditioning said control means when a temperature corresponding to the running temperature of said spindle is sensed.

14. A device according to claim 13, wherein said reference member comprises a proximity sensor, and an element separated from said proximity sensor by an air pad at a predetermined pressure, said proximity sensor being enabled when said element is engaged by said tool with a force at least equal to said predetermined pressure, means being provided for adjusting the pressure of said air pad.

15. In a numerically controlled machine tool for drilling or milling multi-layer printed circuit boards having circuit boards holding table, at least an operating head, displacing means for mutually displacing said table and said head to selected working positions, a rotatable spindle mounted on said head, axially moving means for axially moving said spindle on said head, a working tool removably mounted on said spindle, and a circuit boards hold-down associated with said head, said numerically controlled machine tool for drilling or milling multi-layer printed circuit boards further comprising a working depth controlling device comprising a reference member carried by said table at a predetermined sensing position, control means conditionable for enabling said axially moving said spindle to cause said tool to sense said reference member, at least a pair of telescopic columns for connecting said hold-down with a support of said spindle, a reinforced bracket connecting said columns, a normally effective position transducer connected with said spindle, a second position transducer connected with one of said columns, said second position transducer being disabled by said control means upon said tool sensing said reference member to define a mutual axial distance of said tool with respect to said hold-down as difference of the position indications of said two transducers, heating means conditionable for heating said spindle while said spindle is rotatably standing, temperature sensing means for sensing the temperature of said spindle, and conditioning means controlled by said temperature sensing means for conditioning said control means when a temperature corresponding to the running temperature of said spindle is sensed.

16. A device according to claim 15, comprising a magazine of tools adapted to be automatically inserted into said spindle, comprising logic means arranged for periodically controlling said heating means and said conditioning means at least when a tool for operating on said boards at a controlled working depth is inserted on said spindle.

* * * * *